United States Patent [19]

Yamazaki

[11] Patent Number: 4,640,845
[45] Date of Patent: Feb. 3, 1987

[54] METHOD AND APPARATUS FOR FORMING NON-SINGLE-CRYSTAL LAYER

[75] Inventor: Shunpei Yamazaki, Tokyo, Japan

[73] Assignee: Semiconductor Energy Laboratory Co., Ltd., Japan

[21] Appl. No.: 828,790

[22] Filed: Feb. 13, 1986

Related U.S. Application Data

[62] Division of Ser. No. 533,941, Sep. 20, 1983, Pat. No. 4,582,720.

[30] Foreign Application Priority Data

| Sep. 20, 1982 | [JP] | Japan | 57-163728 |
| Sep. 20, 1982 | [JP] | Japan | 57-163729 |
| Sep. 25, 1982 | [JP] | Japan | 57-167280 |
| Sep. 25, 1982 | [JP] | Japan | 57-167281 |

[51] Int. Cl.$^4$ ............................................. C23C 16/50
[52] U.S. Cl. .................................... 427/38; 118/728; 118/729
[58] Field of Search .................... 427/38, 39; 118/728, 118/729, 720

[56] References Cited

U.S. PATENT DOCUMENTS

| 4,264,393 | 4/1981 | Gorin et al. | 156/345 |
| 4,399,014 | 8/1983 | Engle | 204/192 E |
| 4,401,507 | 8/1983 | Engle | 156/643 |
| 4,438,188 | 3/1984 | Shimatani et al. | 430/128 |
| 4,464,415 | 8/1984 | Yamazaki | 427/39 |

Primary Examiner—John H. Newsome
Attorney, Agent, or Firm—Gerald J. Ferguson, Jr.; Michael P. Hoffman; Ronni S. Malamud

[57] ABSTRACT

A substrate introducing chamber, a reaction chamber and a substrate removing chamber are sequentially arranged with a shutter between adjacent ones of them. One or more substrates are mounted on a holder with their surfaces lying in vertical planes and carried into the substrate introducing chamber, the reaction chamber and the substrate removing chamber one after another. In the reaction chamber, a material gas is guided by gas guides to flow along the substrate surfaces in a limited space in which the substrates are disposed. The material gas is ionized into a plasma through the use of high-frequency energy obtained across a pair electrodes. The line of electric force of the high-frequency energy is directed along the substrate surfaces. By ionization of the material gas into the plasma, a non-single-crystal layer is formed, by deposition, on each substrate. At this time, the substrates are floating off the high-frequency energy source.

21 Claims, 6 Drawing Figures

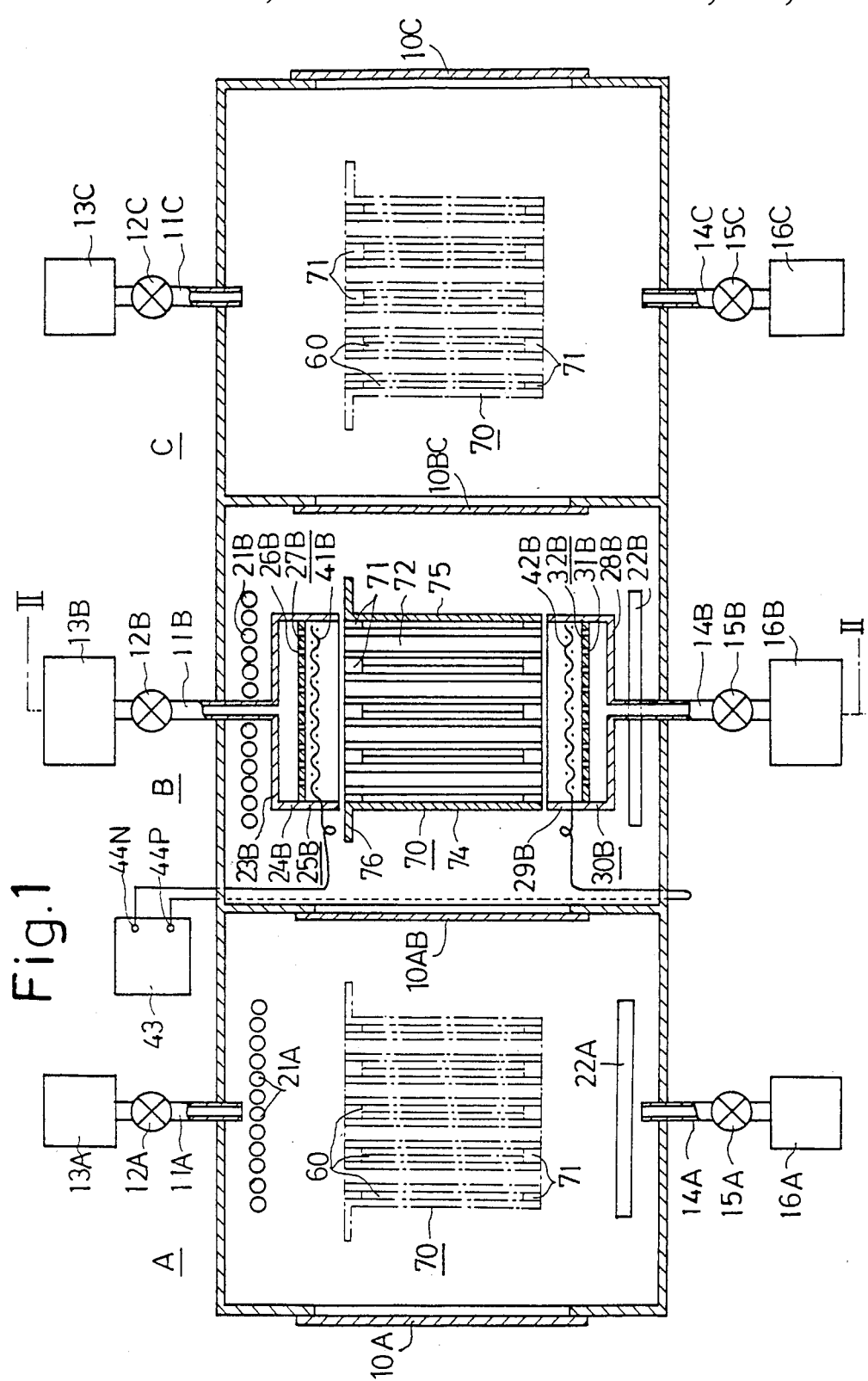

METHOD AND APPARATUS FOR FORMING NON-SINGLE-CRYSTAL LAYER

This is a divisional application of Ser. No. 533,941, filed Sept. 20, 1983 now U.S. Pat. No. 4,582,720.

BACKGROUND OF THE INVENTION

1. Field of the Invention

The present invention relates to a method and apparatus for forming a non-single-crystal layer on a substrate, and more particularly to a method and apparatus for forming a non-single-crystal layer which are suitable for the manufacture of semiconductor photoelectric conversion devices for use as solar cells.

2. Description of the Prior Art

Heretofore there has been proposed a method according to which a material gas for forming a non-single-crystal layer is introduced into a reaction chamber and is excited to form the non-single-crystal layer by deposition on one or more substrates disposed in the reaction chamber.

With such a conventional method, the material gas is introduced into the reaction chamber to fill it up and, consequently, the excited material gas not only passes over the substrates but also unnecessarily flows everywhere in the chamber. Accordingly, the utilization rate of the material gas is as low as about 1 to 3% and, further, the non-single-crystal layer is formed at as low a rate as approximately 0.1 to 2 Å per second.

Moreover, since the excited material gas allowed to flow in contact with the inner wall of the reaction chamber, flakes formed by the excited material gas stick to the inner wall of the reaction chamber, and they often fall off onto the substrate. Accordingly, it is very likely that the non-single-crystal layer contains therein the flakes or has a number of pin-holes resulting from the bombardment by the flakes.

According to the prior art method, in the case of exciting the material gas by ionizing it into a plasma through the use of high-frequency electrical energy, the direction of its electric line of force is selected to cross the substrate. On account of this, the non-single-crystal layer may sometimes be damaged due to sputtering by the excited material gas, i.e. the material gas plasma.

Furthermore, in the case of using high-frequency electrical energy which is obtained across a pair of electrodes, the material gas is excited in such a state that the potential of either one of the electrodes is being applied to the substrate. With this method, however, undesirable flakes formed by the excited material gas stick to the substrate surface, resulting in the non-single-crystal layer containing the flakes in quantity.

A conventional non-single-crystal layer forming apparatus for the abovesaid method naturally possesses such defects as mentioned above.

SUMMARY OF THE INVENTION

It is therefore an object of the present invention to provide a novel non-single-crystal forming method and apparatus which are free from the abovesaid defects.

In accordance with an aspect of the present invention, a material gas stream in the reaction chamber is directed to the limited space in which a substrate is placed, and is passed over the substrate surface, forming thereon a non-single-crystal layer. With this method, the utilization rate of the material gas can be raised as high as about 40 to 70%, which is far higher than in the prior art. Further, the non-single-crystal layer can be formed at a far higher rate than that obtainable with the prior art. In addition, substantially no flakes are formed on the inner wall of the reaction chamber and fall off the inner wall, so the non-single-crystal layer can be formed without containing therein flakes or pinholes.

In accordance with another aspect of the present invention, the non-single-crystal layer is formed on the substrate which is disposed with its surface lying in a vertical plane or plane close thereto. Accordingly, even if flakes are formed by the excited material gas, they do not substantially fall on the substrate, ensuring to form the non-single-crystal layer without containing the flakes or pinholes.

In accordance with another aspect of the present invention, in the case of exciting the material gas by ionizing it into a plasma through the use of high-frequency electric energy, its electric line of force is directed along the substrate surface. This essentially prevents sputtering of the substrate by the material gas plasma, ensuring to obtain the non-single-crystal layer with practically no damages by sputtering.

In accordance with another aspect of the present invention, in the case of ionizing the material gas into a plasma for excitation through the use of high-frequency electric energy which is obtained across a pair of electrodes, the excitation is carried out without applying the potential of either one of the electrodes to the substrate. This essentially prevents that the undesirable flakes formed by the excited material gas stick to the substrate, ensuring to form a homogeneous non-single-crystal layer without the flakes.

In accordance with another aspect of the present invention, the non-single-crystal layer forming apparatus has the arrangement that provides the abovesaid excellent features in the formation of the non-single-crystal layer.

Other objects, features and advantages of the present invention will become more fully apparent from the following description taken in conjunction with the accompanying drawings.

BRIEF DESCRIPTION OF THE DRAWINGS

FIG. 1 is a schematic longitudinal sectional view of an example of the non-single-crystal layer forming apparatus according to the present invention, explanatory of an example of the non-single-crystal layer forming method of the invention;

DESCRIPTION OF THE PREFERRED EMBODIMENTS

Figure 3:
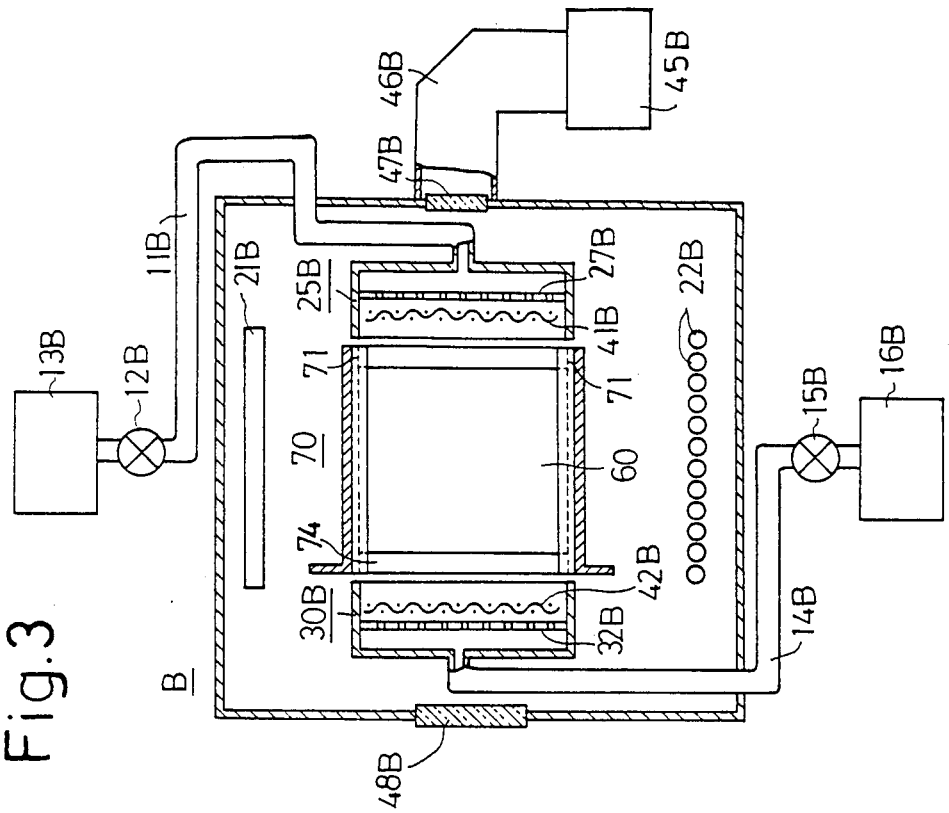
FIG. 3 is a schematic longitudinal sectional view, corresponding to FIG. 2, of another example of the non-single-crystal layer forming apparatus according to the present invention, explanatory of another example of the non-single-crystal layer forming method of the invention.

A description will be given first of the non-single-crystal layer forming apparatus of the present invention.

FIG. 1 illustrates an embodiment of the apparatus which has the following arrangement.

A substrate introducing chamber A, a reaction chamber B and a substrate removing chamber C are arranged in this order.

The substrate introducing chamber A is so designed as to communicate with the outside when a shutter 10A is opened which is provided on the opposite side from the reaction chamber B. The substrate introducing chamber A and the reaction chamber B are constructed so that they intercommunicate when a shutter 10AB is opened which is provided therebetween. The reaction chamber B and the substrate removing chamber C are similarly constructed so that they intercommunicate when a shutter 10BC is opened which is provided therebetween. The substrate removing chamber C is so adapted as to communicate with the outside when a shutter 10C is opened which is provided on the opposite side from the reaction chamber B.

The substrate introducing chamber A is linked with an inert gas source 13A through an inert gas supply pipe 11A and a gas stream control valve 12A, and is linked with an exhaust pump 16A through a gas exhaust pipe 14A and a gas stream control valve 15A.

The reaction chamber B is linked with a material gas source 13B through a material gas supply pipe 11B and a gas stream control valve 12B, and is linked with an exhaust pump 16B through a gas exhaust pipe 14B and a gas stream control valve 15B.

The substrate removing chamber C is linked with an inert gas source 13C through an inert gas supply pipe 11C and a gas stream control valve 12C, and is linked with an exhaust pump 16C through a gas exhaust pipe 14C and a gas stream control valve 15C as is the case with the substrate introducing chamber A.

In the substrate introducing chamber A rod-like infrared heaters 21A are arranged in succession in a horizontal plane to extend in the direction perpendicular to the plane of paper on the side of the top wall of the chamber A. On the side of the bottom wall similar infrared heaters 22A are arranged in succession in a horizontal plane to extend in the direction perpendicular to the direction of extension of the infrared heaters 21A.

Also in the direction chamber B, infrared heaters 21B and 22B are similarly disposed on the side of the top wall and the side of the bottom wall of the chamber B.

On the side of the infrared heaters 21B disposed in the reaction chamber B a gas guide 25B, which is formed by a cylindrical body 24B made of an insulating material and covered at one end with an end plate 23B similarly made of an insulating material, is disposed in the vertical direction with the end plate 23B on the side of the infrared heaters 21B. The gas guide 25B is linked, on the side of the end plate 23B, with the material gas supply pipe 11B extending from the material gas source 13B. In the cylindrical body 24B of the gas guide 25B a plate 27B made of an insulating material and having a number of through holes 26B is disposed in a horizontal plane at a distance from the end plate 23B. On the side of the infrared heaters 22B disposed in the reaction chamber B a similar gas guide 30B, which is formed by a cylindrical body 29B closed at one end with an end plate 28B, is disposed with the end plate 28B on the side of the infrared heaters 22B and coaxially with the gas guide 25B in opposing relation thereto. The gas guide 30B is linked, on the side of the end plate 28B, with the gas exhaust pipe 14B extending from the exhaust pump 16B. In the cylindrical body 29B of the gas guide 30B a plate 32B, which is similar to the aforementioned plate 27B and has a number of through holes 31B, is disposed in a horizontal plane at a distance from the end plate 28B.

In the cylyndircal body 24B of the gas guide 25B a mesh-like or perforated-plate-like gas-permeable electrode 41B is disposed in a horizontal plane on the side of the plate 27B. Further, a similar electrode 42B is disposed in a horizontal plane on the side of the plate 32B in the cylindrical body 29B of the gas guide 30B.

The electrodes 41B and 42B disposed in the reaction chamber B are respectively connected to a cathode terminal 44N and an anode terminal 44P of a high-frequency power source 43 which is disposed outside the reaction chamber B and provides a high frequency of 13.56 MHz.

Figure 2:
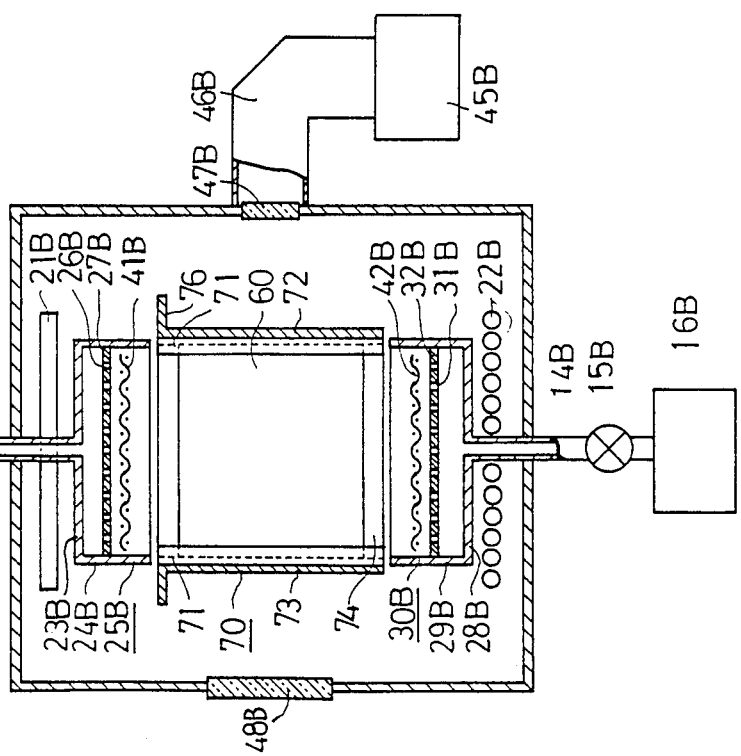
FIG. 2 is a sectional view taken on the line II-II in FIG. 1.

Further, as will be seen from FIG. 2, the reaction chamber B is connected, on the side of its rear panel, to an ultrahigh frequency power source 45B, which is a microwave source or millimeter wave source, through a waveguide 46B and a window 47B which is made in the rear panel of the reaction chamber B and which inhibits the passage therethrough of gas but permits the passage therethrough of ultrahigh frequency power.

Incidentally, as will be seen from FIG. 2, the front panel of the reaction chamber B has made therein an inspection or observation window 48B for observation of the inside thereof. The front panel of each of the substrate introducing chamber A and the substrate removing chamber C has also made therein a similar observation window for observation of the inside thereof, though not shown.

The above is a description of the arrangement of one embodiment of the non-single-crystal layer forming apparatus.

Such a non-single-crystal layer forming apparatus is used with the non-single-crystal layer forming method of the present invention.

Next, a description will be given of the non-single-crystal layer forming method of the present invention.

An example of the non-single-crystal layer forming method is carried out through the use of the above-described apparatus in the following manner:

Outside the apparatus, a number of substrates 60 are premounted on a holder 70 as indicated by the broken lines in the reaction chamber B in FIGS. 1 and 2.

The holder 70 has a square tubular body which is comprised of a pair of plates 72 and 73, each having a number of parallel groove 71 for receiving marginal edges of the substrates 60 and another pair of plates 74 and 75. The plates 72 and 73 are held in vertical planes and in parallel and opposing relation to each other with their grooves 71 extending in the vertical direction. The plates 74 and 75 are also held in vertical planes and in parallel and opposing relation to each other. The holder 70 has a flange 76 which is formed integrally with the square tubular body to extend outwardly thereof in a horizontal plane.

The substrate 60 are received at one of their opposite marginal edges by the grooves 71 of the plate 72 and at the other marginal edge by the grooves 71 of the plate 73 so that they may be held by the holder 70 in parallel and have their surfaces extending in vertical planes. The outermost ones of the substrates 60 on both sides have their backs held in contact with the inner surfaces of the plates 74 and 75, respectively, and the other remaining substrates 60 are held in back-to-back relation to adjacent ones of them.

The holder 70 having mounted thereon the substrates 60 as described above is brought into the substrate introducing chamber A, with the shutter 10A temporarily opened, as indicated by the chain lines in FIG. 1. In this case, the holder 70 is supported by a carrier rod (not shown) at the underside of the flange 76 and brought into the substrate introducing chamber A. The holder 70 thus brought into the chamber A is supported at the underside of the flange 76 by a support member (not shown) which is manipulated from the outside of the substrate introducing chamber A so that the surfaces of the substrates 60 may lie in vertical planes, though not described in detail.

Next, the substrates 60 and the holder 70 are heated by the infrared heaters 21A and 22A provided in the substrate introducing chamber A and, at the same time, gas in the chamber A is discharged by the exhaust pump 16A to the outside through the gas exhaust pipe 14A and the gas stream control valve 15A to make the inside of the substrate introducing chamber A vacuous, thereby cleansing the substrates 60 and the holder 70.

In this while, gas in the reaction chamber B is exhausted by the exhaust pump 16B through the gas exhaust pipe 14B and the gas stream control valve 15B to make the inside of the chamber B vacuous, cleaning it.

Next, the shutter 10AB between the chambers A and B is temporarily opened and the holder 70, which has mounted thereon the substrates 60 purified in the chamber A, is brought into the reaction chamber B while being supported by a carrier rod (not shown) which is inserted from the outside of the substrate introducing chamber A in the same manner as described above. The holder 70 thus brought into the reaction chamber B is supported by a support member (not shown) so that the substrates 60 may be positioned between the gas guides 25B and 30B, with the substrate surfaces held in vertical planes, as described previously.

Next, the gas in the reaction chamber B is discharged by the exhaust pump 16B to the outside through the gas exhaust pipe 14B and the gas stream control valve 15B and, at the same time, a material gas is introduced into the reaction chamber B from the material gas source 13B through the material gas supply pipe 11B and the gas stream control valve 12B. Further, high frequency is applied across the electrodes 41B and 42B from the high-frequency power source 43. At the same time, ultrahigh-frequency power is introduced into the reaction chamber B from the ultrahigh-frequency power source 45B through the waveguide 46B and the window 47B and, further, the inside of the reaction chamber B is heated by the infrared heaters 21B and 22B, by which the material gas introduced into the reaction chamber B is excited for ionization into a plasma. In this way, non-single-crystal layers (not shown) are formed on the substrates 60 in the reaction chamber B.

In this case, when a silane gas is used as the material gas, a non-single-crystal silicon layer; when a gas mixture of aluminum chloride and/or triethyl aluminum, hydrogen and/or helium is employed, a non-single-crystal aluminum layer can be formed; when a gas mixture of a carbonyl compound of iron, nickel or cobalt, hydrogen and/ or helium is employed, a non-single-crystal iron, nichel or cobalt layer can be formed; when a gas mixture of silane and ammonium gases is used, a non-single-crystal silicon nitride layer can be formed; when a gas mixture of a silane gas, nitrogen peroxide and nitrogen is used, a non-single-crystal silicon oxide layer can be formed; and when a gas mixture of a molybdenum chloride gas or tungsten fluoride gas and silane gas is used, a non-single-crystal molybdenum silicide or tungsten silicide layer can be formed.

When the non-single-crystal layers are formed on the substrates 60 in the reaction chamber B, the material gas from the material gas supply pipe 11B enters and spreads between the end plate 23B and the plate 27B having the apertures 26B in the cylindrical body 24B of the gas guide 25B, thence passes through the apertures 26B of the plate 27B and thence flows across the electrode 41B. Then the material gas flows between adjacent ones of the substrates 60. Next, the material gas flows into the cylindrical body 29B of the gas guide 30B, thence flows across the electrode 42B, thence flows through the apertures 31B of the plate 32B, thereafter flowing between the end plate 28B and the plate 32B having the apertures 31B in the cylindrical body 29B of the gas guide 30B. Next, the material gas is discharged to the outside through the gas exhaust pipe 14B, the gas stream control valve 15B and the exhaust pump 16B.

In the reaction chamber B the material gas flows between adjacent ones of the substrate 60 in the space defined by the gas guides 25B and 30B as described above. When the material gas flows between adjacent ones of the C substrates 60, it is limited by the both outermost ones of the substrates 60 and the plates 72 to 75 of the holder 70 from spreading out laterally. The spaces defined between the gas guide 25B and the holder 70 and between the holder 70 and the gas guide 30B are both very small.

Accordingly, the material gas in the reaction chamber B flows along the substrate surfaces in the limited space in which the substrates 60 are disposed.

This permits the formation of the non-single-crystal layers with a high utilization rate of the material gas and at high rate. Further, flakes are hardly formed on the inner wall of the reaction chamber B and, consequently, substantially no flakes fall off the inner wall of the chamber B. Moreover, even if flakes are formed on that part of the holder 70 which is not covered with the substrates 60 and on the interior surface of the gas guide 25B and even if such flakes fall off them, the substrate surfaces are almost free from the bombardment with the flakes because they are held in vertical planes. Accordingly, the non-single-crystal layers can be formed with practically no flakes and pinholes.

The material gas, when flowing between adjacent ones of the substrates 60, is excited into a plasma by high-frequency electric energy which is obtained across the electrodes 41B and 42B by high-frequency power applied thereacross from the high-frequency source 43, ultrahigh-frequency energy which is created by ultrahigh-frequency power supplied into the reaction chamber B and thermal energy which is radiated from the infrared heaters 21B and 22B. In this case, the electrodes 41B and 42B lie in horizontal planes, whereas the substrate surfaces lie in vertical planes. This ensures that the line of electric force of the high-frequency electric energy obtained across the electrodes 41B and 42B is directed along the substrate surfaces.

Therefore, the non-single-crystal layers are not substantially subjected to suputtering by the excited material gas, and hence they can be formed with practically no damages from sputtering.

Besides, when the material gas is ionized into a plasma, the substrates 60 are not supplied with the potential of either of the electrodes 41B and 42B; namely, they are floating off the high-frequency power source 43. This prevents undesirable flakes from sticking to the non-single-crystal layers. Consequently, the non-single-crystal layers can be formed with practically no flakes.

In addition, since the substrates 60 are spaced apart from the electrodes 41B and 42B, the entire area of each substrate surface is positioned in a region in which the high-frequency energy developed across the electrodes 41B and 42B is stable. Accordingly, the non-single-crystal layers can each be formed homogeneously and to the same thickness throughout it.

Further, the electrode 41B disposed upstream of the material gas passage and the electrode 42B disposed downstream of the material gas passage are a cathode and an anode, respectively, so that even if flakes stick to the gas guides 25B and 30B and the holder 70, the amount of flakes sticking to the upstream gas guide 25B and the portion of the holder on the upstream side is far smaller than the amount of flakes sticking to the downstream gas guide 30B and the portion of the holder 70 on the downstream side. Therefore, the non-single-crystal layer can be formed with practically no flakes.

After forming the non-single-crystal layers on the substrates 60 in the reaction chamber B as described above, the supply of the material gas from the material gas source 13B to the reaction chamber B is stopped, holding the inside of the reaction chamber B vacuous.

On the other hand, while the non-single-crystal layers are being formed on the substrates 60 in the reaction chamber B as described above, gas in the substrate removing chamber C is discharged by the exhaust pump 16C to the outside through the gas exhaust pipe 14C and the gas stream control valve 15C to make the inside of the substrate removing chamber C, thereby purifying it.

Next, after the formation of the non-single-crystal layers on the substrates 60 in the reaction chamber B, the shutter 10BC between the chambers B and C is opened and the holder 70 which has mounted thereon the substrates 60, which have formed thereon the non-single-crystal layers, is brought into the substrate removing chamber C as indicated by the chain line in FIG. 1. In this case, the holder 70 is supported by a carrier rod (not shown) inserted from the outside of the chamber C and is moved into the chamber C in the same manner as referred to previously. Further, the holder 70 thus brought into the substrate removing chamber C is supported by a support member (not shown) in the same manner as described previously.

Next, the inert gas is introduced into the substrate removing chamber C from the inert gas source 13C through the inert gas supply pipe 11C and the gas stream control valve 12C so that the pressure in the chamber C rises up to the atmospheric pressure or a pressure close thereto.

Next, the shutter 10C is opened and the holder 70 is brought out of the chamber C, and then the supply of the inert gas from the inert gas source 13C to the substrate removing chamber C is stopped. Finally, the substrates 60 having formed thereon the non-single-crystal layers are dismounted from the holder 70.

In practice, in the period during which the holder 70 (hereinafter referred to as the first holder 70) having mounted thereon the substrates, carried out of the substrate introducing chamber A into the reaction chamber B, is carried out therefrom into the substrate removing chamber C, the inert gas introduced into the substrate introducing chamber A from the inert gas source 13A through the gas supply pipe 11A and the gas stream control valve 12A until the pressure in the chamber A rises up to the atmospheric pressure or a pressure close thereto, after which the shutter 10A is opened and a second holder 70 carrying new substrates 60 is brought into the substrate introducing chamber A and then the supply of the inert gas to the chamber A from the inert gas source 13A is stopped, thereafter holding the inside of the chamber A in a vacuum condition as described previously.

Moreover, when the first holder 70 carrying the substrates 60 with the non-single-crystal layers formed thereon is brought into the substrate removing chamber C from the reaction chamber B, the second holder 70 placed in the chamber A until then is brought out therefrom into the reaction chamber B, with the shutter 10AB opened, and then non-single-crystal layers are formed on the substrates mounted on the second holder 70 as described previously. And, in the period in which the non-single-crystal layers are thus formed on the substrate 60 mounted on the holder 70, a third holder 70 is carried into the substrate introducing chamber A in the same way as described previously.

Furthermore, after the first holder 70 carrying the substrates 60 with the non-single-crystal layers formed thereon is brought out of the substrate removing chamber C and after the inside of the chamber C is made vacuous, the second holder 70 is carried into the chamber C and, at the same time, the third holder 70 is carried out of the chamber A into the chamber B.

In the manner described above, the substrates 60 having formed thereon the non-single-crystal layers are continuously obtained.

The above is a description of an example of each of the non-single-crystal layer forming method and apparatus of the present invention. Next, a description will be given of modifications and variations of this invention method and apparatus.

The reaction chamber B of the apparatus described previously in connection with FIGS. 1 and 2 can be modified as follows: That is, the gas guides 25B and 30B in the chamber B can also be disposed on the sides of the rear and front walls of the chamber B instead of being disposed on the sides of the top and bottom walls thereof as shown in FIG. 3. Needless to say, in this case, the apertured plate 27B and the electrode 41B are disposed in the gas guide 25B, and the apertured plate 32B and the electrode 42B are placed in the gas guide 30B as is the case with FIGS. 1 and 2.

Further, when such apparatus as shown in FIG. 3 is used, the non-single-crystal layer forming method is modified correspondingly as follows:

While in the foregoing example the holder 70 is designed so that when it is transferred into the chambers A, B and C one after another, its grooves 71 extend in the vertical direction and, consequently, the substrates 60 mounted on the holder 70 lie in the vertical planes, the holder 70 is adapted so that its grooves 71 extend in the horizontal direction and so that the substrates 60 lie in vertical planes.

In such a case, though not described in detail, the relation between the substrates 60 and the material gas flow and the relation between the substrates 60 and the electrodes 41B and 42B in the reaction chamber B are the same as those in the case of FIGS. 1 and 2, so that non-single-crystal layers can be formed on the substrates 60 with the same excellent features as described previously in respect of FIGS. 1 and 2.

With the non-single-crystal layer forming method of the present invention described in the foregoing, the substrates 60 are transferred through the chambers A, B and C while being held with the substrate surfaces in vertical planes.

Figure 4:
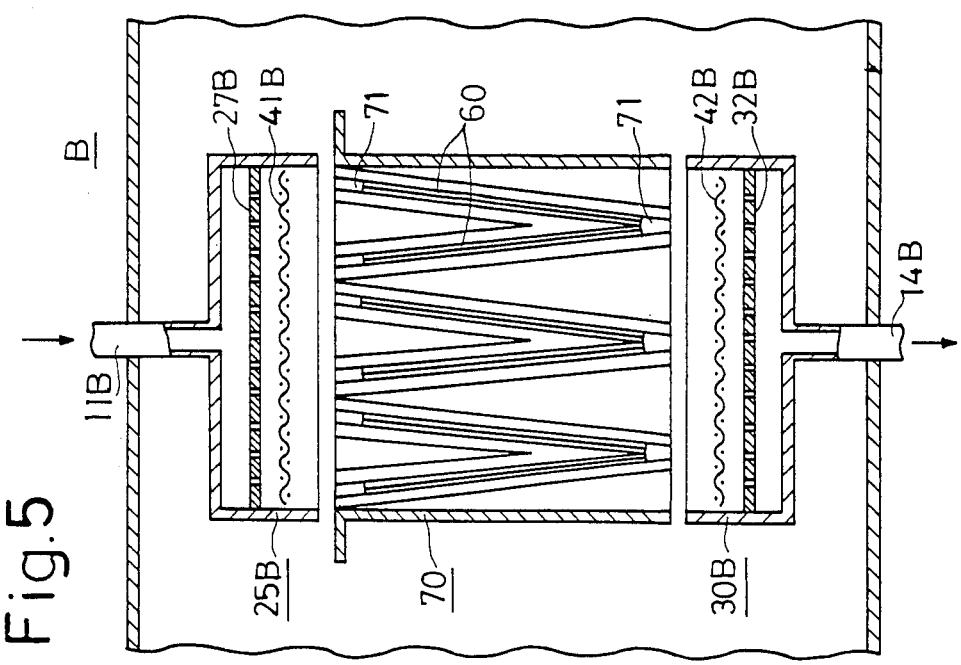
FIGS. 4 and 5 are schematic sectional view respectively illustrating modified forms of a holder for use in the non-single-crystal layer forming method of the present invention.
Figure 5:
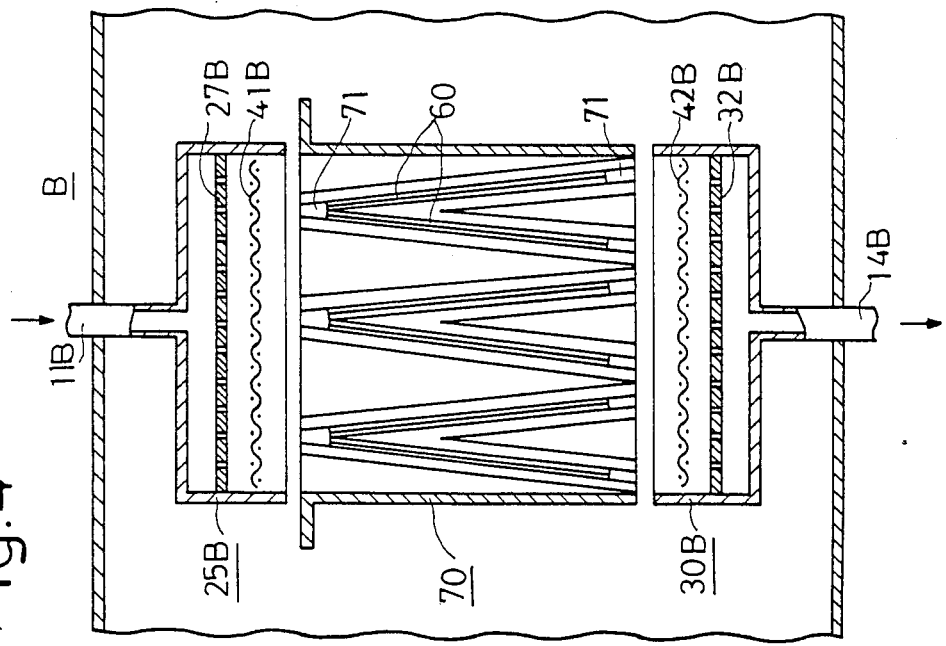

However, though not described in detail, even if the substrates 60 are mounted on the holder 70 with the substrate surface aslant as shown in FIGS. 4 and 5, when the inclination angle of the substrate surface to the vertical plane is sufficiently small, non-single-crystal layers can be formed on the substrates 60 in the same manner as described previously.

Besides, although in the foregoing one non-single-crystal layer is formed on each substrate 60 in the reaction chamber B, it is also possible to form a plurality of non-single-crystal layers of different kinds on each substrate 60 by introducing different material gases one after another into the reaction chamber B while the substrates 60 are held therein.

Figure 6:
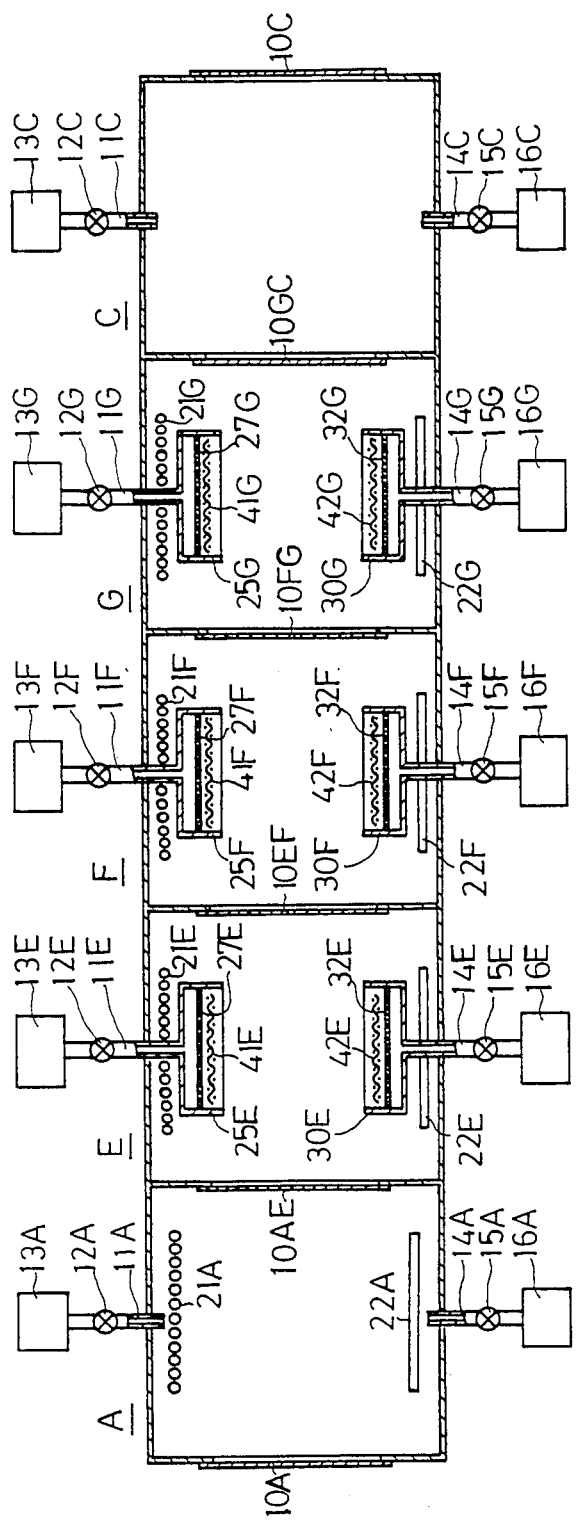
FIG. 6 is a schematic longitudinal sectional view, corresponding to FIG. 1, of another example of the non-single-crystal layer forming apparatus according to the present invention, explanatory of another example of the non-single-crystal layer forming method of the invention.

Moreover, while in the foregoing the non-single-crystal layer forming apparatus has one reaction chamber B, plural, for instance, three reaction chambers E, F and G, similar to the reaction chamber B, may also be arranged successively between the substrate introducing chamber A and the substrate removing chamber C through shutters 10AE, 10EF, 10FG and 10GC which are similar to the shutters 10AB and 10BC as shown in FIG. 6. In this case, a material gas source 13E is linked with the reaction chamber E through a material gas supply pipe 11E and a gas stream control valve 12E, and an exhaust pump 16E is linked with the reaction chamber E through a gas exhaust pipe 14E and a gas stream control valve 15E. A material gas source 13F is linked with the reaction chamber F through a material gas supply pipe 11F and a gas stream control valve 12F, and an exhaust pump 16F is linked with the reaction chamber F through a gas exhaust pipe 14F and a gas stream control valve 15F. A material gas source 13G is linked with the reaction chamber G through a material gas supply pipe 11G and a gas stream control valve 12G, and an exhaust pump 16G is linked with the reaction chamber G through a gas exhaust pipe 14G and a gas stream control valve 15G.

Further, in the reaction chamber E are disposed infrared heaters 21E and 22E similar to the aforementioned ones 21B and 22B, gas guides 25E and 30E similar to the aforementioned ones 25B and 30B, plates 27E and 32E similar to the aforementioned ones 27B and 32B, and electrodes 41E and 42E similar to the aforementioned ones 41B and 42B. In the reaction chamber F are disposed infrared heaters 21F and 22F similar to the aforementioned ones 21B and 22B, gas guides 25F and 30F similar to the aforementioned ones 25B and 30B plates 27F and 32F similar to the aforementioned ones 27B and 32B, and electrodes 41F and 42F similar to the aforementioned ones 41B and 42B. In the reaction chamber G are disposed infrared heaters 21G and 22G similar to the aforementioned ones 21B and 22B, gas guides 25G and 30G similar to the aforementioned ones 25B and 30B, plates 27G and 32G similar to the aforementioned ones 27B and 32B, and electrodes 41G and 42G similar to the aforementioned ones 41B and 42B.

With the use of the non-single-crystal layer forming apparatus shown in FIG. 6, since it has the three reaction chambers E, F and G, it is possible to form on each substrate 60 three non-single-crystal layers in the form of a laminate layer in the reaction chambers E, F and G one after another in the same manner as described previously. Accordingly, it is possible to fabricate on each substrate a photoelectric conversion device which has a P type non-single-crystal semiconductor layer, an I type non-single-crystal semiconductor layer and an N type non-single-crystal semiconductor layer formed in succession and serves as a solar cell.

Although in the foregoing the high frequency energy, the ultrahigh-frequency energy and the thermal energy are employed for excitation of the material gas, the ultrahigh-frequency energy and the thermal energy need not always used, and photo energy can also be employed in place of one or more of the high-frequency, the ultrahigh-frequency and the thermal energy.

It will be apparent that many modifications and variations may be effected without departing from the scope of the novel concepts of the present invention.

What is claimed is:

1. A non-sinle-crystal layer forming method in which a material gas for forming a non-single-crystal layer is introduced into a reaction cahamber and is excited to form the non-single-crystal alyer by deposition on one or more substrates placed in the reaction chamber, wherein the material gas is confined within a region within the reaction chamber, said region being defined by first and second cup-shaped gas guide members and a tubular holder for at least one substrate wherein the material gas is guided by said first and second cup-shaped gas guide members provided upstream and downstream of said tubular substrate holder, respectively, so that the material gas stream is confined to said region to pass along the substrate surfaces.

2. A non-single-crystal layer forming method according to claim 1, wherein the substrates are disposed at predetermined intervals, and wherein the material gas stream passing along the surface of each of the substrate is prevented by both outermost ones of them from spreading laterally.

3. A non-single-crystal layer forming method according to claim 1, wherein said tubular holder has first and second plates extending along the vertical planes with the substrates vertically disposed therebetween, and wherein the material gas stream is prevented by the first and second plates from spreading laterally.

4. A non-single-crystal layer forming method according to claim 1, 2 or 3, wherein the material gas is ionized into a plasma for excitation through the use of high-frequency electric energy having its line of electric force extending along the substrate surfaces.

5. A non-single-crystal layer forming method according to claim 4, wherein the high-frequency electric energy is obtained across first and second electrodes disposed in the reaction chamber, and wherein the material gas is ionized into a plasma in such a state that the substrates are disposed between the first and second electrodes and are not supplied with the potential of either of the first and second electrodes.

6. A non-single-crystal layer forming method according to claim 5, wherein the material gas is ionized into a plasma in such a state that the first electrode is disposed as a cathode upstream of the material gas passage and the second electrode is disposed as an anode downstream of the material gas passage.

7. A non-single-crystal layer forming method according to claim 6, wherein the material gas is ionized into a plasma in such a sate that electrodes permitting the passage therethrough of the material gas are disposed as the first and second electrodes in the first and second gas guide means.

8. A non-single-crystal layer forming method according to claim 1, 2 or 3, wherein the material gas is excited by ionization into a plasma through the use of high-frequency energy having its line of electric force extending along the substrate surfaces and ultrahigh-frequency electric energy.

9. A non-single-crystal layer forming method according to claim 1, 2 or 3, wherein the material gas is excited by photo energy.

10. A non-single-crystal layer forming method according to claim 1, 2 or 3, wherein the material gas is excited by electric and photo energy.

11. A non-single-crystal layer forming apparatus which is provided with a reaction chamber for forming a non-single-crystal layer on one or more substrates disposed therein, means for introducing a material gas into the reaction chamber, means for exhausting gas from the reaction chamber and means for exciting the material gas introduced into the reaction chamber, the improvement comprising means for confining said material gas within a region within the reaction chamber, said region being defined by (a) first and second cup-shaped gas guide members provided in the reaction chamber on the material gas introducing side and on the gas exhausting side, respectively, for guiding the material gas to pass it along the substrate surfaces in the limited space in which the substrates are disposed and (b) a tubular holder for at least one substrate, the tubular substrate holder being disposed between said first and second cup-shaped guide members so that the material gas stream is confined to said region to pass along the substrate surface.

12. Non-single-crystal layer forming apparatus according to claim 11, wherein the material gas exciting means is provided with first and second electrodes for obtaining high-frequency electric energy, and wherein the first and second electrodes are disposed so that the line of electric force of the high-frequency electric energy may extend along the substrate surfaces.

13. Non-single-crystal layer forming apparatus according to claim 12, wherein the first and second electrodes are disposed as a cathode and an anode upstream and downstream of a material gas passage, respectively.

14. Non-single-crystal layer forming apparatus according to claim 13, wherein the first and second electrodes have the property of permitting the passage therethrough of the material gas, and are disposed in the first and second gas guide means, respectively.

15. Non-single-crystal layer forming apparatus according to claim 12, wherein the material gas exciting means is provided with means for supplying ultrahigh-frequency electric energy into the reaction chamber.

16. A method as in claim 1 including disposing said substrates in said holder in vertical planes or in planes close thereto.

17. A method as in claim 1 or 16 including orienting said first and second cup-shaped guide members and said tubular substrate holder such that the flow of said material gas is substantially vertical as is passes through the region of its confinement.

18. A method as in claim 1 or 16 including orienting said first and second cup-shaped guide members and said tubular substrate holder such that the flow of said material gas is substantially horizontal as is passes through said region of confinement of the material gas.

19. Apparatus as in claim 11 including means for disposing said substrates in said holder in vertical planes or in planes close thereto.

20. Apparatus as in claim 11 or 19 where said first and second cup-shaped guide members and said tubular substrate holder are so oriented that the flow of said material gas is substantially vertical as it passes through the region of its confinement.

21. Apparatus as in claim 11 or 19 where said first and second cup-shaped guide members and said tubular substrate holder are so oriented that the flow of said material gas is substantially horizontal as it passes through said region of confinement of the material gas.

* * * * *